United States Patent
Sungail et al.

(10) Patent No.: US 12,221,678 B2
(45) Date of Patent: Feb. 11, 2025

(54) POWDER METALLURGY SPUTTERING TARGETS AND METHODS OF PRODUCING SAME

(71) Applicant: Global Advanced Metals USA, Inc., Wellesley Hills, MA (US)

(72) Inventors: Craig M. Sungail, Chadds Ford, PA (US); Aamir Dawood Abid, Spring City, PA (US); Stephen Krause, Phoenixville, PA (US)

(73) Assignee: GLOBAL ADVANCED METALS USA, INC., Wellesley Hills, MA (US)

( * ) Notice: Subject to any disclaimer, the term of this patent is extended or adjusted under 35 U.S.C. 154(b) by 1160 days.

(21) Appl. No.: 16/286,842

(22) Filed: Feb. 27, 2019

(65) Prior Publication Data
US 2019/0271068 A1 Sep. 5, 2019

Related U.S. Application Data

(60) Provisional application No. 62/793,418, filed on Jan. 17, 2019, provisional application No. 62/693,540, filed on Jul. 3, 2018, provisional application No. 62/638,328, filed on Mar. 5, 2018.

(51) Int. Cl.
*C23C 14/34* (2006.01)
*B22F 1/05* (2022.01)
(Continued)

(52) U.S. Cl.
CPC ............... *C22C 28/00* (2013.01); *B22F 1/05* (2022.01); *B22F 1/052* (2022.01); *B22F 1/0553* (2022.01);
(Continued)

(58) Field of Classification Search
CPC .... B22F 1/0011; B22F 1/0014; B22F 1/0048; B22F 1/0055; B22F 1/0085; B22F 1/0088;
(Continued)

(56) References Cited

U.S. PATENT DOCUMENTS 2,950,185 A 8/1960 Hellier et al.
3,767,456 A 10/1973 Glaski
(Continued)

FOREIGN PATENT DOCUMENTS

CN 108500281 A 9/2018
EP 0528974 B1 7/1997
(Continued)

OTHER PUBLICATIONS

Machine Translation JP 2001-073128 (Year: 2001).*
(Continued)

*Primary Examiner* — Rodney G McDonald
(74) *Attorney, Agent, or Firm* — Kilyk & Bowersox, P.L.L.C.

(57) ABSTRACT

The present invention relates to sputtering targets and other metal articles as well as methods of making the same. More particularly, the present invention relates to methods for forming powder metallurgy sputtering targets and other metallurgical articles made from metal powders that include spherical metal powders, and the resulting product.

21 Claims, 1 Drawing Sheet

(51) Int. Cl.

| | | |
|---|---|---|
| *B22F 1/052* | (2022.01) | |
| *B22F 1/054* | (2022.01) | |
| *B22F 1/065* | (2022.01) | |
| *B22F 1/068* | (2022.01) | |
| *B22F 1/142* | (2022.01) | |
| *B22F 1/145* | (2022.01) | |
| *B22F 3/24* | (2006.01) | |
| *B22F 9/20* | (2006.01) | |
| *C22C 1/04* | (2023.01) | |
| *C22C 28/00* | (2006.01) | |

(52) U.S. Cl.
CPC .............. *B22F 1/065* (2022.01); *B22F 1/068* (2022.01); *B22F 1/142* (2022.01); *B22F 1/145* (2022.01); *B22F 3/24* (2013.01); *B22F 9/20* (2013.01); *C22C 1/04* (2013.01); *C23C 14/3414* (2013.01); *B22F 2003/248* (2013.01); *B22F 2202/13* (2013.01); *B22F 2304/10* (2013.01)

(58) Field of Classification Search
CPC .......... B22F 3/02; B22F 3/1017; B22F 3/162; B22F 3/24; B22F 9/18; B22F 9/20; B22F 2001/0037; B22F 2003/248; B22F 2002/13; B22F 2304/10; B22F 2298/10; B22F 2999/00; C22C 1/04; C22C 28/00; C23C 14/3414
USPC ....................... 204/298.12, 298.13
See application file for complete search history.

(56) References Cited

U.S. PATENT DOCUMENTS

| | | | |
|---|---|---|---|
| 3,829,310 | A | 8/1974 | Mahy |
| 3,974,245 | A | 8/1976 | Cheney et al. |
| 4,062,678 | A | 12/1977 | Dreyer et al. |
| 4,067,736 | A | 1/1978 | Vartanian |
| 4,149,876 | A | 4/1979 | Rerat |
| 4,684,399 | A | 8/1987 | Bergman et al. |
| 4,805,704 | A | 2/1989 | Kobashi et al. |
| 4,940,490 | A | 7/1990 | Fife et al. |
| 4,945,452 | A | 7/1990 | Sturmer et al. |
| 5,200,595 | A | 4/1993 | Boulos et al. |
| 5,211,741 | A | 5/1993 | Fife |
| 5,217,526 | A | 6/1993 | Fife |
| 5,234,491 | A | 8/1993 | Chang |
| 5,242,481 | A | 9/1993 | Kumar |
| 5,245,514 | A | 9/1993 | Fife et al. |
| 5,306,462 | A | 4/1994 | Fife |
| 5,412,533 | A | 5/1995 | Murayama et al. |
| 5,448,447 | A | 9/1995 | Chang |
| 5,498,446 | A | 3/1996 | Axelbaum et al. |
| 5,580,367 | A | 12/1996 | Fife |
| 5,580,516 | A | 12/1996 | Kumar |
| 5,837,121 | A | 11/1998 | Kinard et al. |
| 5,935,408 | A | 8/1999 | Kinard et al. |
| 5,993,513 | A | 11/1999 | Fife |
| 6,051,044 | A | 4/2000 | Fife |
| 6,072,694 | A | 6/2000 | Hahn et al. |
| 6,136,176 | A | 10/2000 | Wheeler et al. |
| 6,162,345 | A | 12/2000 | Kinard et al. |
| 6,191,013 | B1 | 2/2001 | Hahn et al. |
| 6,312,642 | B1 | 11/2001 | Fife |
| 6,322,912 | B1 | 11/2001 | Fife |
| 6,328,927 | B1 | 12/2001 | Lo et al. |
| 6,338,816 | B1 | 1/2002 | Fife |
| 6,348,113 | B1 | 2/2002 | Michaluk et al. |
| 6,373,685 | B1 | 4/2002 | Kimmel et al. |
| 6,375,704 | B1 | 4/2002 | Habecker et al. |
| 6,391,275 | B1 | 5/2002 | Fife |
| 6,416,730 | B1 | 7/2002 | Fife |
| 6,420,043 | B1 | 7/2002 | Fife et al. |
| 6,462,934 | B2 | 10/2002 | Kimmel et al. |
| 6,527,937 | B2 | 3/2003 | Fife |
| 6,551,377 | B1 | 4/2003 | Leonhardt |
| 6,558,447 | B1 | 5/2003 | Shekhter et al. |
| 6,576,099 | B2 | 6/2003 | Kimmel et al. |
| 6,582,641 | B1 | 6/2003 | Lo et al. |
| 6,616,623 | B1 | 9/2003 | Kutushov |
| 6,639,787 | B2 | 10/2003 | Kimmel et al. |
| 6,643,121 | B1 | 11/2003 | Huntington |
| 6,699,757 | B1 | 3/2004 | Hwang |
| 6,699,767 | B1 | 3/2004 | Huntington |
| 6,759,026 | B2 | 7/2004 | Kimmel et al. |
| 6,770,154 | B2 | 8/2004 | Koenigsmann et al. |
| 6,788,523 | B1 | 9/2004 | Hossick-Schott et al. |
| 6,804,109 | B1 | 10/2004 | Hahn et al. |
| 6,813,140 | B1 | 11/2004 | Huntington |
| 6,849,292 | B1 | 2/2005 | Huntington |
| 6,870,727 | B2 | 3/2005 | Edson et al. |
| 6,896,782 | B2 | 5/2005 | Melody et al. |
| 7,081,148 | B2 | 7/2006 | Koenigsmann et al. |
| 7,172,985 | B2 | 2/2007 | Pinceloup et al. |
| 7,190,571 | B2 | 3/2007 | Heusmann et al. |
| 7,220,397 | B2 | 5/2007 | Kimmel et al. |
| 7,241,436 | B2 | 7/2007 | Fife |
| 7,442,227 | B2 | 10/2008 | Rosen et al. |
| 7,445,679 | B2 | 11/2008 | Koenitzer et al. |
| 7,445,762 | B2 | 11/2008 | Fife |
| 7,485,198 | B2 | 2/2009 | Michaluk |
| 7,515,397 | B2 | 4/2009 | Reed et al. |
| 7,601,296 | B2 | 10/2009 | Michaluk et al. |
| 7,655,214 | B2 | 2/2010 | Reed et al. |
| 7,803,235 | B2 | 9/2010 | Venigalla |
| 8,040,060 | B2 | 10/2011 | Fukasawa et al. |
| 8,110,172 | B2 | 2/2012 | Reed et al. |
| 8,168,118 | B2 | 5/2012 | Michaluk et al. |
| 8,657,915 | B2 | 2/2014 | Mizusaki et al. |
| 9,669,460 | B2 * | 6/2017 | Naito ................... B22F 1/0018 |
| 9,725,793 | B2 | 8/2017 | Aimone et al. |
| 9,957,592 | B2 | 5/2018 | Aimone et al. |
| 10,413,427 | B2 | 9/2019 | Trieu |
| 10,422,025 | B2 | 9/2019 | Aimone et al. |
| 2003/0019326 | A1 | 1/2003 | Han et al. |
| 2003/0230167 | A1 | 12/2003 | Loeffelholz et al. |
| 2004/0262157 | A1 | 12/2004 | Ford et al. |
| 2006/0201589 | A1 | 9/2006 | Morales et al. |
| 2006/0204395 | A1 | 9/2006 | Johnson, Jr. |
| 2011/0308965 | A1 * | 12/2011 | Rasheed ................... C25C 3/34  75/343 |
| 2013/0327571 | A1 * | 12/2013 | Andrzejak ............... F42B 1/032  175/2 |
| 2015/0162172 | A1 * | 6/2015 | Lo ........................ C23C 14/3414  204/298.13 |
| 2015/0292081 | A1 | 10/2015 | Hogan et al. |
| 2020/0046510 | A1 | 2/2020 | Maale |
| 2020/0046512 | A1 | 2/2020 | Newman et al. |
| 2020/0048746 | A1 | 2/2020 | Aimone et al. |

FOREIGN PATENT DOCUMENTS

| | | | |
|---|---|---|---|
| JP | 2001-73128 | * | 3/2001 |
| JP | 2005-336617 A | | 12/2005 |
| JP | 2008533299 A | | 8/2008 |
| JP | 2009527640 A | | 7/2009 |
| KR | 20160133263 A | | 11/2016 |
| WO | WO 2016/192049 | * | 12/2016 |
| WO | 2017048199 A1 | | 3/2017 |
| WO | WO 2017/115648 | * | 7/2017 |
| WO | 2018050473 A1 | | 3/2018 |
| WO | 2019197376 A1 | | 10/2019 |

OTHER PUBLICATIONS

Savich et al. Electrical pulse sintering and conventional vacuum sintering of permeable materials from non-spherical and spherical titanium powders, Metal Powder Report, vol. 71, Issue 4, Jul.-Aug. 2016, pp. 258-260. (Year: 2016).*
Machine Translation WO 2016/192049 (Year: 2016).*
Machine Translation WO 2017/115648 (Year: 2017).*

(56) References Cited

OTHER PUBLICATIONS

International Search Report and Written Opinion issued in corresponding International Patent Application No. PCT/US2019/019720 dated Dec. 11, 2019 (15 pages).
Liu et al., "Spheroidization of molybdenum powder by radio frequency thermal plasma," International Journal of Minerals, Metallurgy and Materials, XP-035581971, 2015, pp. 1212-1218, vol. 22, No. 11.
Webb, P. A., "Volume and Density Determinations for Particle Technologists," Micromeritics Instrument Corp., XP-002495931, www.micromeritics.com/pdf/app_articles/density_determinations.pdf, 2001, pp. 1-15.
Strauss et al., "Investigation of Using Laser-Beam Powder-Bed-Fusion With a Mixture of Powders to Achieve In-Situ Alloying," vol. 55, No. 2, 2019, pp. 43-50 (8 pages).
Nanyang Technological University, Singapore, Tech Offers "Novel Titanium based alloy for better orthopaedic mplants," https://sc3dp.ntu.edu.sg/Research/Tech-Offers/Pages/Novel-titanium-based-alloy-for-better-orthopaedic-Implants.aspx, Feb. 25, 2020, (2 pages).
U.S. Appl. No. 16/286,683, filed Feb. 27, 2019 (64 pages).
U.S. Appl. No. 16/286,998, filed Feb. 27, 2019 (57 pages).
Alec, "Researchers use titanium-tantalum alloy to improve stress absorption of 3D printed implants," 3D printer and 3D printing news, 2016.
Barr et al., "Processing Salt-encapsulated Tantalum Nanoparticles for High Purity, Ultra High Surface Area Applications," Journal Nanoparticles Research, 2006, vol. 8, pp. 11-22.
Boulos, "Plasma power can make better powders," Elsevier Ltd., 2004, vol. 59, Issue 5, pp. 16-21.
Yang et al., "Control of the Nano-Particle Weight Ratio in Stainless Steel Micro and Nano Powders by Radio Frequency Plasma Treatment," Metals, 2015, vol. 5, pp. 2058-2069.
Yang et al., "Preparation of Spherical Titanium Powders from Polygonal Titanium Hydride Powders by Radio Frequency Plasma Treatment," Materials Transactions, 2013, vol. 54, No. 12, pp. 2313-2316.
www.globaladvancedmetals.com/our-products/additive-manufacturing.aspx (2018).
Office Action issued in corresponding Japanese Patent Application No. 2020-546440 dated Sep. 22, 2021 (with English translation) (14 pages).
Office Action issued in corresponding Chinese Patent Application No. 201980016967.X issued Feb. 11, 2022 (English translation only) (11 pages).

* cited by examiner

KDEL

Spherical Tantalum Powder

T-Powder

Spherical Tantalum Powder

POWDER METALLURGY SPUTTERING TARGETS AND METHODS OF PRODUCING SAME This application claims the benefit under 35 U.S.C. § 119(e) of prior U.S. Provisional Patent Application No. 62/638,328 filed Mar. 5, 2018; U.S. Provisional Patent Application No. 62/793,418 filed Jan. 17, 2019, and U.S. Provisional Patent Application No. 62/693,540 filed Jul. 3, 2018, which are incorporated in their entireties by reference herein.

BACKGROUND OF THE INVENTION

The present invention relates to sputtering targets and other metal articles as well as methods of making the same. More particularly, the present invention relates to methods for forming powder metallurgy sputtering targets and other metallurgical articles made from metal powders that include spherical metal powders, and the resulting product.

Sputtering targets are used for many purposes, including producing thin films of metals or compounds. In a sputtering process, a source material is bombarded with plasma ions that dislodge or eject atoms from the surface of a sputter target. The ejected atoms are deposited atop a substrate to form a film coating that is typically several atomic layers thick.

Sputtering targets can be made from valve metal materials and other metal materials. Valve metals generally include tantalum, niobium, and alloys thereof, and also may include metals of Groups IVB, VB, and VIB and alloys thereof. Valve metals are described, for example, by Diggle, in "Oxides and Oxide Films", Vol. 1, pages 94-95, 1972, Marcel Dekker, Inc., New York, incorporated in its entirety by reference herein.

Semiconductor technology is a large market for tantalum sputtering targets. Semiconductors are the building blocks of a class of microelectronic devices that include microprocessors found in mainframe computers, work stations, and PCs, digital signal processors for cell phones and telecommunication equipment, and application-specific integrated circuits used in digital organizers, cameras, and electronic appliances.

Driven by continuous reductions in costs, device size, and improved performance, copper is replacing aluminum for use as interconnects in next generation semiconductors. To prevent the copper of the interconnects from migrating through the semiconductor device and "poisoning" the transistors and other electronics, a diffusion barrier is commonly interposed between the interconnects and the device. Tantalum (Ta) and tantalum nitride (TaN), which is typically produced by the reactive sputtering of a tantalum target in the presence of nitrogen, are commonly-used barrier materials for copper interconnects. By way of example, microprocessors operating at clock speeds in excess of 1000 MHz, such as AMD's Althon and Intel's Pentium 4, as well as IBM's I STAR and P-750 processors found in modern mainframe systems, each use copper interconnects along with a tantalum diffusion barrier layer.

Films having uniform chemistry and thickness are preferred for diffusion barrier applications. To obtain uniform chemistry and thickness, it is preferable to sputter a target having certain desirable properties, including, high purity, a fine grain size, and a homogeneous texture void of strong (001) texture bands. Commonly, tantalum materials produced from ingot metallurgy (ingot-met) techniques as described, for example, in U.S. Pat. No. 6,348,113 (Michaluk et al.), which is incorporated in its entirety by reference herein, are specified for sputtering applications. Ingot-met tantalum material may produce the purity levels and maximum grain size desirable for diffusion bather applications. However, by nature, it is difficult to refine and control the grain size and texture homogeneity in high purity, unalloyed and undoped metallic materials. As such, the minimum average recrystallized grain size attainable in wrought high purity ingot-met tantalum targets may be about 10 microns. In addition, ingot-met tantalum targets may also exhibit textural banding and consequently may produce sputtered films of highly variable thicknesses.

Powder metallurgy (powder-met) techniques offer an alternative method of manufacturing articles such as, but not limited to, sputtering targets. Proper processing can produce powder-met sputtering targets having a finer grain size than that attainable in ingot-met targets. The higher amounts of interstitial impurities inherent in the powder-met materials increase the work hardening rate, and hence the rate of new dislocation line length generation and subsequent recrystallization response during annealing, by behaving like a dispersion of fine particles within the matrix. For this reason, a smaller, more homogeneous grain structure is achieved in commercially produced powder-met thin gauge strip and wire than that which is attainable in ingot-met products of similar gauge.

The (isostatic) consolidation of metal powders is a viable and established means of producing certain metal articles having a random and homogeneous texture. The combination of fine grain size having a random distribution of crystal orientations promote the uniformity of work (e.g., homogeneous strain hardening of all grains) during subsequent deformation processing of powder-met tantalum sputtering targets, thus avoiding the formation of sharp texture bands in powder-met sputtering targets. The powder-met tantalum sputtering targets are expected to deposit films having exceptional thickness uniformity.

Commercially available tantalum powder and other metal powders, however, can generally contain unacceptably high levels of oxygen for use in diffusion barrier applications. For instance, under ambient conditions, tantalum metal has a passive coating, e.g., such as approximately 1 nm or less to 3 nm or more thick oxide film that is comprised of tantalum oxide and absorbed oxygen gas (L. A. Rozenberg and S. V. Shtel'maid, "State of Oxygen in Tantalum Powders," *Ivestiya Akademii Naut SSSR. Metally*, (4) 1985, pp. 163, incorporated in its entirety by reference herein). Commercial tantalum powder that is deoxidized and then exposed to oxygen to reform a passive oxide coating will still typically contain more than 100 ppm oxygen.

Accordingly, further methods for forming sputtering targets or other metal articles produced from the metal powder are needed, such as sputtering targets for depositing high-integrity films via reactive sputtering.

SUMMARY OF THE PRESENT INVENTION

It is therefore a feature of the present invention to provide a powder metallurgy sputtering target and/or other metal articles from spherical metal powder.

A further feature is to provide a method to form a powder metallurgy sputtering target and/or other metal articles.

Another feature of the present invention is to provide a sputtering target assembly having or including a consolidated spherical metal powder sputtering target and a backing plate.

Another feature of the present invention is to provide a sputtering target having an average grain size of about 100 microns or less.

Another feature of the present invention is to provide a sputtering target having a random texture and/or uniform crystalline texture.

Another feature of the present invention is to provide a metal article formed from the bcc spherical metal powder, such as a sputtering target, having an average grain size of about 100 microns or less and a texture that lies on or near (e.g. within 10%) the (111)-(100) symmetry line of the Maxwell standard orientation triangle.

Additional features and advantages of the present invention will be set forth in part in the description that follows, and in part will be apparent from the description, or may be learned by practice of the present invention. The objectives and other advantages of the present invention will be realized and attained by means of the elements and combinations particularly pointed out in the description and appended claims.

To achieve these and other advantages, and in accordance with the purposes of the present invention, as embodied and broadly described herein, the present invention relates to a powder metallurgy formed product, such as a sputtering target. The powder utilized is or includes a spherical metal powder.

The spherical metal powder, such as a spherical tantalum powder, includes a spherical shape wherein the powder has an average aspect ratio of from 1.0 to 1.4; a metal purity of at least 99 wt % based on total weight of the metal powder, excluding gas impurities; an average particle size of from about 0.5 micron to about 250 microns; a true density that is within +−3% of the metal (e.g., for tantalum, a true density of from 16 g/cc to 16.7 g/cc); an apparent density of from about 4 g/cc to about 19.3 g/cc; and a Hall flow rate of 40 sec or less. The spherical metal powder can be, and preferably is a plasma heat-treated powder.

The present invention further relates to a method of forming a sputtering target or other metal article. The method can involve consolidating the spherical metal powder into a consolidated body by a powder metallurgy technique. The method can involve sintering of the consolidated body to form a sintered consolidated body. The spherical metal powder can optionally be consolidated directly into the shape of a sputtering target by a powder metallurgy technique. Optionally, the consolidated body or sintered consolidated body can further be machined or processed and/or subjected to metal finishing step(s) by conventional metal processing techniques.

The present invention further relates to a formed metallurgical article having an oxygen content of about 600 ppm or less and optionally a nitrogen content of at least about 10 ppm.

It is to be understood that both the foregoing general description and the following detailed description are exemplary and explanatory only and are intended to provide a further explanation of the present invention, as claimed.

DETAILED DESCRIPTION OF THE PRESENT INVENTION

Figure 1A:
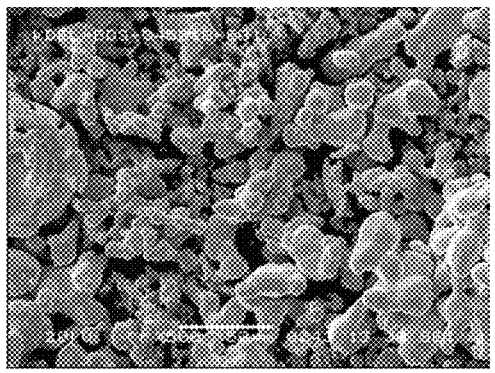
FIG. 1A is a SEM photograph of the starting basic lot tantalum powder used in Example 1 and FIG. 1B is a SEM photograph of the finished tantalum powder of Example 1 after plasma treatment.

The present invention is directed to providing a powder metallurgy formed product from metal powder that is or includes a spherical metal powder, such as a spherical valve metal powder.

The spherical metal powder can optionally have an oxygen content of 600 parts per million (ppm) or less, and more preferably 500 ppm or less or 300 ppm or less (e.g., 50 ppm to 600 ppm oxygen or 200 ppm to 500 ppm oxygen).

Optionally, the spherical metal powder can have a nitrogen content of at least 10 ppm, and more preferably at least 50 ppm (e.g., 10 ppm to 1,000 ppm or more, or 50 ppm to 1,000 ppm).

The spherical metal powder can be a BCC spherical metal powder or a refractory spherical metal powder. The spherical metal powder can be a spherical valve metal powder, such as tantalum, niobium, or alloys thereof. Other spherical metal powders can also be used.

Specific examples of the type of metals for the spherical metal powders include, but are not limited to, tantalum, niobium, aluminum, copper, titanium, magnesium, tungsten, gold, silver, cobalt, zirconium, silicon, rhenium, molybdenum, and/or alloys thereof and/or spherical metal powders containing one or more of these metals. Examples of alloys include, but are not limited to, AlZnO [AZO], copper-chromium, copper-titanium, copper-nickel, titanium-tungsten, titanium-copper, titanium-iron, titanium-nickel, titanium-aluminum, or NiPt. Further details of the spherical metal powder are provided below.

The present invention further relates to a method for forming sputtering targets and other metal articles from the spherical metal powder. Other metal articles include, but are not limited to, wrought products (e.g., plates, billets, bars, rolls, molded shapes and the like).

The present invention further relates to the metal films produced by sputtering the powder metallurgy formed sputtering targets.

In the present invention, a formed metallurgical article, such as a sputtering target, can have an oxygen content below about 600 ppm, such as below 500 ppm or below 400 ppm or below 300 ppm or below 200 ppm oxygen (e.g., 50 ppm to 600 ppm oxygen or 100 ppm to 500 ppm oxygen). Other oxygen levels are possible outside of these ranges.

By forming the powder metallurgy formed product from metal powder that includes or is spherical metal powder as described herein, the ability to obtain powder packing close to the theoretical density for packed beds is possible, such that the powder packing is at least 70% of the theoretical density for the pack beds (e.g., at least 75%, at least 80%, at least 85%, at least 90%, or at least 95% or at least 98%). Achieving such desirable packing density in turn leads to better consolidation of the powder into a green product such as a green log.

Upon forming into a green product which can be considered a form of the consolidated product, such as a green log, the green product can be further densified such as by heating (e.g. resistive heating under vacuum or sintering) which can provide a dense consolidated product, such as a dense billet or other shape.

As an option, the consolidated product, for instance a billet or other shape, can for instance, be divided into a plurality of divided consolidated products. For instance, a consolidated product, such as a billet, can be sliced into multiple discs for sputter targets or other uses.

In general, post mechanical processing (e.g., forging, rolling, or other working of the article or other dimension altering steps, and the like) is optional. Such post mechanical processing can be one or more thermomechanical processing step(s). Specific examples of rolling include, but are not limited to, hot rolling, cold rolling, cross-rolling, flat rolling, forge rolling, clock rolling, multi-directional rolling. The rolling can reduce the thickness of the consolidated product by 1% to 50% of the starting thickness, such as from about 2% to 40%, or from about 3% to 30% or from about 5% to 25%, or from about 5% to 20%, of from about 10% to 20% and this reduction in thickness can be done in one pass or multiple passes (such as 1 pass to 20 passes, or 1 pass to 15 passes or from 1 pass to 15 passes). When conducting multiple passes through the roller, the rolled product can be turned upside down, turned 90 degrees, or turned in other angles prior to the next rolling. Cold rolling is at ambient temperatures and the warm or hot rolling is at temperatures above ambient temperature and generally less than about 500° C. Specific examples of forging include, but are not limited to, press forging, roll forging, induction forging, upset forging, multidirectional forging, hot forging, cold forging, side forging, hammer forging, round forging, flat forging, radial forging, and the like. Other examples of mechanical processing include, but are not limited to, hot extruding, cold extruding, and the like. Any combination of mechanical processing steps or techniques can be utilized. One or more forging steps (the same or different from each other) can be utilized. One or more rolling steps (the same or different from each other) can be utilized. A combination of one or more rolling steps with one or more forging steps can be utilized (e.g., rolling-forging-rolling, or forging-rolling-forging, or rolling, rolling, forging, rolling, rolling, and the like). Any mechanical processing step can have one or more prior annealing or heat treatment steps of the consolidated product. Any mechanical processing step can have one or more annealing or heat treatment steps after the mechanical processing step. Annealing temperatures can be at any temperature below the melting point of the consolidated product. Typically, these annealing temperatures will be from about 900° C. to about 1500° C., but can be lower than 900° C., and can be higher than 1500° C. Any rolling and/or forging step can achieve at least partial recrystallization or crystal re-orientation. Any annealing or heat treatment can achieve at least partial recrystallization. Any annealing can be vacuum annealing at a sufficient temperature and for a sufficient time to achieve recrystallization of the consolidated product.

As an option, post mechanical processing or working of the consolidated product or divided consolidated product can be avoided or skipped. This is a possible option since the quality of the powder metallurgy formed product can be already of acceptable quality in terms of uniform grain size and/or texture.

Regarding the metal powder that is consolidated, as indicated, this includes one or more spherical types of metal powders. Methods to make the spherical metal powders and other details of the spherical metal powders are described below. If more than one type of metal powder is used, generally, the powder blending step (e.g., a dry powder blending) can occur to blend or mix the powders together.

Regarding the consolidation to form the consolidated product, any powder metallurgy consolidation process and device can be used. The consolidation can be metal compaction step or die compaction step.

The consolidation can occur at room temperature (e.g., 20 deg C. to 25 deg C.) or can occur at elevated temperatures (e.g., from 100 deg C. to 1200 deg C.).

The consolidation can occur at atmospheric pressure or under vacuum or in an inert atmosphere or other gas atmosphere (e.g., nitrogen).

Exemplary of the powder metallurgy techniques used for forming the metal products are summarized below. Any one or more of the following techniques can be used in the present invention to form the powder metallurgy formed product:

Cold Isostatic Pressing
Hot Isostatic Pressing
Extrusion
Powder Forging (e.g., hot forging)
Metal Injection Moulding
Electric Current assisted sintering (ECAS) techniques (e.g., hot pressing, spark plasma sintering, electro sinter forging)
Vacuum Hot Pressing.

A combination of the techniques can be used, and these techniques can be combined with sintering, encapsulating, and mechanical or thermo-mechanical processing steps to form the powder metallurgy formed product. Examples of a combination of steps are provided below:

1. Cold Isostatic Pressing, Sintering, Encapsulating, Hot Isostatic Pressing and Thermo-Mechanical Processing;
2. Cold Isostatic Pressing, Sintering, Hot Isostatic Pressing and Thermo-Mechanical Processing;
3. Cold Isostatic Pressing, Encapsulating, Hot Isostatic Pressing and Thermo-Mechanical Processing;
4. Cold Isostatic Pressing, Encapsulating and Hot Isostatic Pressing;
5. Encapsulating and Hot Isostatic Pressing;
6. Cold Isostatic Pressing, Sintering, Encapsulating, Extruding and Thermo-Mechanical Processing;
7. Cold Isostatic Pressing, Sintering, Extruding, and Thermo-Mechanical Processing;
8. Cold Isostatic Pressing, Sintering, and Extruding;
9. Cold Isostatic Pressing, Encapsulating, Extruding and Thermo-Mechanical Processing;
10. Cold Isostatic Pressing, Encapsulating and Extruding;
11. Encapsulating and Extruding;
12. Mechanical Pressing, Sintering and Extruding;
13. Cold Isostatic Pressing, Sintering, Encapsulating, Forging and Thermo-Mechanical Processing.
14. Cold Isostatic Pressing, Encapsulating, Forging and Thermo-Mechanical Processing;
15. Cold Isostatic Pressing, Encapsulating and Forging;
16. Cold Isostatic Pressing, Sintering, and Forging;
17. Cold Isostatic Pressing, Sintering and Rolling;
18. Encapsulating and Forging;
19. Encapsulating and Rolling;
20. Cold Isostatic Pressing, Sintering and Thermo-Mechanical Processing;
21. Spray Depositing;
22. Mechanical Pressing and Sintering; and
23. Mechanical Pressing, Sintering, Repressing and Resintering.

Other combinations of consolidating, heating and deforming may also be used. Examples of powder-met techniques are described, for example, in U.S. Pat. No. 5,580,516 (Kumar), incorporated in its entirety by reference herein.

The metallurgical article or powder metallurgy formed article described above is preferably a sputtering target assembly including two components, namely, a backing plate and a sputter target.

The sputter target and the backing plate can be any suitable target grade and backing plate grade materials.

The powder used to make the metallurgical article such as the sputtering target as well as the resulting metallurgical article, such as the sputter target can have any purity with respect to the metal. For instance, the purity can be 99% (by wt) or greater such as from about 99.5% or greater and more preferably 99.95% or greater and even more preferably 99.99% or greater (such as from about 99.95% to 99.995% or 99.99% to 99.995%).

The metallurgical article such as a sputter target can have any suitable grain size and/or texture. For instance, the article can have an average grain size of about 300 microns or less and more preferably an average grain size of 100 microns or less and even more preferably an average grain size of about 50 microns or less and most preferably an average grain size of about 10 microns. Suitable ranges include from about 10 microns to about 100 microns in average grain size.

As an option, the maximum grain size in a metallurgical article of the present invention can be 300 microns or less, or 250 microns or less, 200 microns or less, or 150 microns or less, or 100 microns or less.

In addition, the texture of the metallurgical article can be random, such that the grains comprising the metal article exhibit minimal or no preferred crystallographic orientation. Or, the metal article can have an orientation that lies along or near the (111)-(100) symmetry line of the Maxwell standard orientation triangle. Examples of orientations include a primary (111) texture or a primary (100) texture that can be on the surface or throughout the entire thickness of the metallurgical article.

Preferably, the texture or crystallographic orientation is uniform or substantially uniform (e.g., within 25% or within 10% of uniformity or put another way, the texture does not vary more than 25% or 10% throughout the entire thickness of the metallurgical article).

The article can have a mixed (111):(110) texture throughout the surface or throughout the entire thickness of the metallurgical article.

The metallurgical article can be substantially void of textural banding, such as substantially void of (100) textural banding.

The metallurgical article can be drawn, stretched, or extruded to produce a (110) texture. The (110) crystal planes in Body Center Cubic (BCC) metals have the highest areal density of atoms, and sputtering targets having a (110) can have a higher sputtering yield compared to sputtering targets having other primary orientations.

With respect to the target materials to be used in the method of the present invention, examples include, but are not limited to, tantalum, niobium, cobalt, tungsten, titanium, copper, aluminum, and alloys thereof, for instance, the alloys described above.

Examples of the backing plate include, but are not limited to, copper, or a copper alloy, tantalum, niobium, cobalt, titanium, aluminum, and alloys thereof, such as TaW, NbW, TaZr, NbZr, TaNb, NbTa, TaTi, NbTi, TaMo, NbMo, and the like.

No limitation exists as to the type of materials used in the sputtering target and the backing plate.

The thicknesses of the backing and the target material can be any suitable thickness used for forming sputtering targets.

Alternatively, the backing plate and the target material or other metal plate to be bonded onto the backing plate can be any suitable thickness for the desired application. Examples of suitable thicknesses of the backing plate and of the target material include, but are not limited to, a backing plate with a thickness of from about 0.25 or less to about 2 inches or more in thickness and targets with a thickness ranging from about 0.06 inches to about 1 inch or greater.

The sputtering target can also have an interlayer as is conventional in the industry. Furthermore, the sputtering target can be a hollow cathode magnetron sputtering target or can be other forms of sputtering targets.

Except as mentioned herein, the purity, texture, and/or grain size and other properties, including size and the like are not critical to the present invention.

The present invention also provides a method of making a powder-met sputtering target assembly with any type of sputter target and backing plate.

As one example of the present invention, consolidating can include compressing the metal powder to about 80% to about 100% of theoretical density with compressive forces of from about 30,000 to about 90,000 psi or amounts of compressive forces.

In the method of the present invention, one or more additives can be mixed with the metal powder to form a blend. Examples of additives include, but are not limited to, lubricants and/or binders. Particular examples include, but are not limited to, wax, a plastic (e.g., polyethylene), or surfactant, or Camphor, carbonates (e.g., poly(propylene carbonate) such as QPAC), and the like. The additive(s) if present, can be used in an amount of from about 0.1 wt % to about 25 wt % based on the total weight of the blend to be consolidated.

In a further example, the sputtering target of the present invention can have a yield strength from about 18,000 psi to about 40,000 psi and/or an elongation to failure of greater than 20% when tested in tension at a strain rate of 0.005 inches/inch per minute for a standard ASTM E8 subscale tensile tested in accordance to ASTM E8.

TaN thin films can be used as a diffusion bather for copper interconnects in high-speed microprocessors, and are commonly deposited by reactive sputtering of tantalum in the presence of nitrogen. The sputtering target according to the present invention can be used in nitride film sputter applications, given the nitrogen content level that can be attained in the sputtering target formed.

Regarding further details of the spherical metal powder used to form the powder metallurgy formed product, the following is provided.

To form the spherical metal powder, a spheroidization process is used. A preferred process is plasma spheroidization, since it has been found that this process provides the energy needed to melt the metal quickly and produces a truly spherical metal powder with high purity, and/or low oxygen, and/or minimal gas entrapment and/or a controlled particle size distribution (PSD).

In more detail, the metal powder of the present invention comprises, consists essentially of, consists of, or includes a spherical shape wherein the powder has an average aspect ratio of from 1.0 to 1.4; a purity of metal of at least 99 wt % metal based on total weight of the metal powder, excluding gas impurities; an average particle size of from about 0.5 micron to about 250 microns; a true density of from 1.7 g/cc to 21 g/cc such as from 2 g/cc to 20 g/cc or 4.5 g/cc to 20 g/cc, or from 10 g/cc to 20 g/cc, or from 6.5 g/cc to 20 g/cc, or from 9 g/cc to 20 g/cc, from 16 g/cc to 16.7 g/cc; an apparent density of from about 4 g/cc to about 19.3 g/cc; and a Hall flow rate of 40 sec or less. The reference to 'true density' is a measurement of the actual density of the metal powder. Most materials will not have the theoretical density of that metal due to porosity or other reasons. With the metal powder used in the present invention, the metal in the metal powder has an actual density (considered the true density) that is within 3%, or within 2%, or within 1% of the theoretical density for that metal. For instance, tantalum has a theoretical density of 16.6 g/cc, and the tantalum spherical powder used in the present invention can have a true (or actual) density of 16.6 g/c or within 3% of 16.6 g/cc.

Except for the properties set forth above for the metal powder with respect to spherical shape, purity, average particle size, density and Hall flow rate, it is to be understood that there are no other critical limitations with regard to the type of metal powder, that can be used in the methods of the present invention as described herein.

The metal powder that is formed into a spherical metal powder can be what is considered sodium reduced metal powder, or a reduced metal powder, or it can be vapor phased-reduced metal, or ingot-derived metal powder.

The metal powder that is consolidated includes or has a spherical shape. This shape is defined by an average aspect ratio. The average aspect ratio of the metal powder or aspect ratio is defined herein as the ratio of the largest linear dimension of a particle (i.e., metal powder) to the smallest linear dimension of the same particle (i.e., metal powder) based on measuring randomly 50 particles or 100 particles or measuring randomly about 1% by weight to about 2% by weight of the batch of powder. The measuring of the metal particles is done using Scanning Electron Micrograph (SEM) images. True spherical particles have an aspect ratio of 1.0. For purposes of the present invention, the metal powder is considered spherical when the average aspect ratio is from 1.0 to 1.4, or from 1.0 to 1.3, or from 1.0 to 1.25, or from 1.0 to 1.2, or from 1.0 to 1.15, or from 1.0 to 1.1 or from 1.0 to 1.05, or from about 1.05 to about 1.25, or from 1.05 to about 1.2, or from 1.05 to about 1.1, or about 1.0.

The spherical metal powder utilized has a high purity metal powder, meaning the metal powder has a purity of at least 99 wt % metal, based on total weight of the metal powder, excluding gas impurities. The purity level can be measured by x-ray fluorescence, Inductively Coupled Plasma Atomic Emission Spectroscopy (ICP-AES) or ICP Atomic Emission Spectroscopy, or Inductively Coupled Plasma Mass Spectrometry (ICP-MS) or ICP Mass Spectrometry or Glow Discharge Mass Spectrometry (GDMS), Spark Source Mass Spec (SSMS) Analysis, or any combinations thereof. The metal purity can be at least 99.9 wt %, at least 99.95 wt %, at least 99.99 wt %, at least 99.995 wt %, or from about 99.9 wt % to 99.9995 wt %, or from about 99.95 wt % to 99.9995 wt %, or from about 99.99 wt % to 99.9995 wt % or other purity values or ranges. These desirable purity levels are further present in the consolidated product. For instance, for the example of tantalum, the metal purity can be at least 99.95 wt % Ta, at least 99.99 wt % Ta, at least 99.995 wt % Ta, or from about 99.9 wt % Ta to 99.9995 wt %, or from about 99.95 wt % Ta to 99.9995 wt % Ta, or from about 99.99 wt % Ta to 99.9995 wt % Ta or other purity values or ranges.

The spherical metal powder has an average particle size of from about 0.5 micron to about 250 microns. The average particle size is determined by measuring randomly 50 particles using laser diffraction, or dynamic light scattering, or dynamic image analysis techniques, such as an HORIBA LA-960 or LA-300 Laser Particle Size Analyzer, or a HORIBA SZ-100 Nanopartica Instrument, or an HORIBA Camsizer or Camsizer X2 dynamic image analysis system. The average particle size can be from about 0.5 micron to about 10 microns, or from about 5 microns to about 25 microns, or from about 15 microns to about 45 microns, or from about 35 microns to about 75 microns, or from about 55 microns to about 150 microns, or from about 105 microns to about 250 microns.

The spherical metal powder has an apparent density of from about 4 g/cc to about 19.3 g/cc, such as from about 4 g/cc to 12.6 g/cc, or from about 4 g/cc to about 17 g/cc, or from about 4.5 g/cc to about 12 g/cc or from about 5 g/cc to about 10 g/cc or from about 6 g/cc to about 12.5 g/cc or other apparent density numbers within these ranges. The apparent density is measured according to ASTM B212 standard.

The spherical metal powder has a Hall flow rate of 40 seconds or less. The Hall Flow test is conducted according to ASTM B213 standard, where the metal powder is timed as it flows through the orifice of a Hall Flowmeter funnel. The Hall flow rate of the metal powder of the present invention can be 35 seconds or less, or 30 seconds or less, or 25 seconds or less, or 20 seconds or less, or 19 seconds or less, 15 seconds or less, 10 seconds or less, or from 4 seconds to 20 seconds, or from 5 seconds to 20 seconds, or from 6 seconds to 20 seconds, or from 4 seconds to 15 seconds, or from 4 seconds to 12 seconds, or from 5 seconds to 15 seconds, or other values in these ranges.

As indicated, the spherical metal powder can be, and preferably is plasma heat-treated.

The spherical metal powder can have various oxygen levels. For instance, the powder can have an oxygen level of 2,500 ppm or less, or 1,000 ppm or less, or less than 500 ppm, or less than 400 ppm, or less than 300 ppm, or less than 250 ppm, or less than 200 ppm, such as from about 100 ppm to 495 ppm, or from about 150 ppm to about 400 ppm.

As an option, the spherical metal powder can be an alloy. For instance, the metal powder can be a Ta—Ti alloy or a Ta—Si alloy or Ta—W alloy or Ta—Mo alloy or Ta—Nb alloy, or other Ta-metal alloys. The alloy percentages can be Ta: 30 wt % to 99.9 wt % and for the other non-Ta metals in the alloy, the wt % can be from 0.1 wt % to 70 wt %, based on the total weight of the alloy. The Ta-metal alloy can be tantalum with one other metal, two other metals, or three or more other metals present but not as impurities. The tantalum in the Ta-metal alloy can be the predominate metal (e.g., the tantalum is the metal present in the highest percent based on the weight of the alloy). One further example of a Ta-metal alloy is Ta—Nb—Ti.

The spherical metal powder can have one or more other properties selected from the following:
  a D10 size of from about 5 microns to about 25 microns; and/or
  a D90 size of from about 20 microns to about 80 microns.

The spherical metal powder can be a non-aggregated powder, wherein the properties/parameters described herein are for a non-aggregated powder.

The spherical metal powder can be a non-agglomerated powder, wherein the properties/parameters described herein are for a non-agglomerated powder.

As an option, the metal powder can be phosphorous doped. For instance, the phosphorous doped levels can be at least 50 ppm, or at least 100 ppm, or, for instance, from about 50 ppm to about 500 ppm, and the like. Phosphoric acid or ammonium hexafluorophosphate and the like are suggested as the forms of phosphorus.

As an option, the metal powder can be doped with other elements, such as yittrium, silica, or one or more other dopants, such as gas and/or metal dopants. The doped levels can be at least 5 ppm, at least 10 ppm, at least 25 ppm, at least 50 ppm, or at least 100 ppm, or, for instance, from about 5 ppm to about 500 ppm, and the like. One or more dopants can be used for grain stabilization and/or for other property enhancements of the powder or the resulting article made from the powder.

As an option, in the present invention, the metal powder utilized to form the sputter target can further include one or more non-spherical metal powder(s).

The non-spherical metal powder can be, comprise, consists of, consist essentially of, or include angular metal powder, flake metal powder, and/or nodular metal powder, or any combinations thereof.

The metal powder can be, comprise, consists of, consist essentially of, or include from 1% to 99% by weight of the spherical metal powder and from 1% to 99% by weight of the non-spherical metal powder, or from 25% to 75% by weight of the spherical metal powder and from 25% to 75% by weight of the non-spherical metal powder, or from 50% to 99% by weight of the spherical metal powder and from 1% to 50% by weight of the non-spherical metal powder, or from 75% to 99% by weight of the spherical metal powder and from 1% to 25% by weight of the non-spherical metal powder.

As an option, the spherical metal powder to be consolidated can be, comprise, consists of, consist essentially of, or include comprises at least two different size fractions, wherein the size fraction is based on average particle size of the size fraction. For instance, the spherical metal powder can be, comprise, consists of, consist essentially of, or include a first size fraction having an average particle size from about 10 microns to about 25 microns, and a second size fraction of from about 26 microns to about 45 microns.

The spherical metal powder of the present invention can be made using a plasma heat-treating process. For instance, a process to make the metal powder of the present invention can comprise, consists essentially of, consists of, or include step a: plasma heat-treating a starting metal powder to at least partially melt at least an outer surface of the starting metal powder in an inert atmosphere to obtain a heat-treated metal powder, and then step b: cooling the heat-treated metal powder in an inert atmosphere to obtain said metal powder. The starting metal powder can be fully melted or at least 90% by weight melted by the plasma treatment (e.g., in the plasma torch region of the plasma reactor).

In the process, the starting metal powder can be a sodium-reduced valve metal powder or other reduced valve metal powder, or be any other source of valve metal powder as mentioned herein. In the process, the starting valve metal powder can be a basic lot valve metal powder.

The starting valve metal powder used in the process to make the valve metal powder of the present invention can be what is considered basic lot powder, such as basic lot valve metal. The starting valve metal powder that can be used can be what is considered secondary particles of plasma-treated valve metal powders.

In the process, the starting metal powder can be ingot-derived metal. In the process, the starting metal powder can be powder metallurgy (powder-met) derived metal powder.

As an option, the starting metal powder can be non-hydrided or can be hydrided before being introduced into the plasma treatment.

In the process to make the metal powder, prior to step a, the starting metal powder can be formed by sintering a first metal powder to obtain a sintered powder (which can be in the form of a sintered mass such as a green log or other shape), and then e-beam melting of the sintered powder or mass to obtain an ingot, and then reducing the ingot to the starting metal powder. The sintering can occur at conventional sintering temperatures for metal powder. For instance, and only as an example, the metal powder can be sintered at a temperature of from about 700 deg C. to about 1,450 deg C. (or from about 800 deg C. to about 1,400 deg C., or from about 900 deg C. to about 1,300 deg C.). The sintering time can be from 1 minute to several hours, such as from about 10 minutes to 4 hours or from 10 minutes to 3 hours, or from about 15 minutes to about 2 hours or from about 20 minutes to about 1 hour or other time periods. As an option, one or more heat treatments or sinterings can occur, whether at the same temperature, same times, or at different temperatures and/or different heat treatment times. The sintering can occur in an inert atmosphere such as an argon atmosphere. The sintering can occur in a conventional furnace used for sintering of metal powders.

In the option to form a metal ingot that is then reduced to a powder, the metal ingot can have or be any volume or diameter or shape. The electron beam processing can occur at a melt rate of from about 300 lbs. to about 800 lbs. per hour using 20,000 volts to 28,000 volts and 15 amps to 40 amps, and under a vacuum of from about $1 \times 10^{-3}$ Torr to about $1 \times 10^{-6}$ Torr. More preferably, the melt rate is from about 400 lbs. to about 600 lbs. per hour using from 24,000 volts to 26,000 volts and 17 amps to 36 amps, and under a vacuum of from about $1 \times 10^{-4}$ Torr to $1 \times 10$ Torr. With respect to the VAR processing, the melt rate is preferably of 500 lbs. to 2,000 lbs. per hour using 25 volts to 45 volts and 12,000 amps to 22,000 amps under a vacuum of $2 \times 10^{-2}$ Torr to $1 \times 10^{-4}$ Torr, and more preferably 800 lbs. to 1200 lbs. per hour at from 30 volts to 60 volts and 16,000 amps to 18,000 amps, and under a vacuum of from $2 \times 10^{-2}$ Torr to $1 \times 10^{-4}$ Torr.

The metal ingot can have a diameter of at least 4 inches or at least 8 inches, or have a diameter of at least 9½ inches, at least 11 inches, at least 12 inches, or higher. For instance, the metal ingot can have a diameter of from about 10 inches to about 20 inches or from about 9½ inches to about 13 inches, or from 10 inches to 15 inches, or from 9½ inches to 15 inches, or from 11 inches to 15 inches. The height or length of the ingot can be any amount, such as at least 5 inches or at least 10 inches or at least 20 inches, at least 30 inches, at least 40 inches, at least 45 inches, and the like. For instance, the length or height of the ingot can be from about 20 inches to about 120 inches or from about 30 inches to about 45 inches. The ingot can be cylindrical in shape, though other shapes can be used. After the formation of the ingot, optionally, the ingot can be machine cleaned using conventional techniques. For instance, the machine cleaning (off the surface) can result in a reduction in the diameter of the ingot, such as diameter reduction of from about 1% to about 10%. As a specific example, the ingot can have a nominal as-cast diameter of 12 inches and, due to machine cleaning, can have a diameter after machine cleaning of 10.75 to 11.75 inches in diameter.

The metal ingot can be reduced to a starting metal powder by making the ingot brittle and then crushing the ingot or subjecting the ingot to particle reduction steps such as milling, jaw crushing, roll crushing, cross beating and the like. To make the ingot brittle, the ingot can be hydrided such as by placing the ingot in a furnace with a hydrogen atmosphere.

With regard to the plasma heat-treating, this can also be known as plasma treatment or plasma processing. In the present invention, a RF plasma treatment or induction plasma treatment can be used. For instance, an RF thermal plasma system or an induction plasma reactor can be used, such as one from Tekna, Sherbrooke, QC, Canada, such as a PL-35LS or PL-50 or TEK-15 or other models. The central gas for the plasma can be argon, or a mixture of argon with other gases, or other gases such as helium and the like. The feed rate of the central gas can be a suitable flow such as from about 10 L/min to about 100 L/min or from about 15 L/min to about 60 L/min or other flow rates. The sheath gas for the plasma can be argon, or a mixture of argon with other gases, or other gases such as other inert gases or helium and the like. The feed rate of the sheath gas can be a suitable flow such as from about 10 L/min to about 120 L/min or from about 10 L/min to about 100 L/min or other flow rates. The carrier gas for the starting metal powder can be argon, or a mixture of argon with other gases (e.g., hydrogen can be added to increase the plasma intensity), or other gases such as other inert gases or helium and the like. The feed rate of the carrier gas can be a suitable flow such as from about 1 L/min to about 15 L/min or from about 2 L/min to about 10 L/min or other flow rates. The feeding rate of the starting metal powder into the plasma torch area can be any flow rate, such as from about 1 g/min of metal powder to about 120 g/min or from about 5 g/min to about 80 g/min of starting metal powder. Generally, a lower feed rate of the starting metal powder ensures more uniform and more complete spheroidal processing of the starting metal powder. After exiting the plasma torch area, a quench gas can be optionally used, such as through one or more quenching ports. The quench gas can be any suitable non-reactive gas, such a helium or argon. If used, the quenching gas can be fed at a variety of flow rates. For instance, the flow rate of the quench gas can be from about 25 L/min to 300 L/min or from about 50 L/min to about 200 L/min or other amounts. As an option, instead of or in addition to using a quench gas, gravity and/or a water-cooled cooling jacket can be used. The designs described in U.S. Pat. No. 5,200,595 and WO 92/19086 can be used. As an option, a passivation gas can be used after the powder is quenched or after the powder begins to cool down. The passivation gas can be oxygen, air, or a combination of air and oxygen. The flow rate of the passivation gas can be any flow rate, such as a flow rate of from about 0.1 L/min to about 1 L/min or other amounts. The chamber pressure of the plasma torch can be any suitable pressure, such as from about 0.05 MPa to about 0.15 MPa. The plate voltage can be from about 5 kV to about 7.5 kV. The frequency of the RF plasma system can be 3 MHz or other values. The plate current can be from about 2.5 A to about 4.5 A. The power can be from about 15 kW to about 35 kW. The distance from the plasma torch to the feeding nozzle or the probe position can be adjusted or varied. The distance can be 0 cm, or about 0 cm or from about 0 cm to about 8 cm. The greater the distance, the less surface evaporation of the starting powder. Thus, if the starting metal powder is very irregular and has aspect ratios of over 2 or over 3, an option is to have the distance of the feeding nozzle close to 0 cm. If the starting metal powder is more regular in shape, such as having aspect ratios of from about 1.3 to 2, the distance of the feeding nozzle can be further away from the plasma torch as an option. Also, a higher plasma powder setting can also be used to handle more irregular shaped starting metal powders.

As an option, the powder that has been plasma treated can be collected, such as collected under a protective atmosphere, such as an inert gas like argon. The collected powder can be passivated, such as using a water bath. The collected powder can be introduced into a water bath (e.g., submerged in a water bath).

As an option, the collected powder can be subjected to a sonication or other powder vibratory method to remove small particles such as nano materials deposited on the metal surface of the metal spheres (e.g., removing satellites and other loose material on the spheres). The resulting recovered metal spheres can optionally be dried, for instance, under a protective gas, such as an inert gas, like argon. This drying can be at any temperature, for instance, at a temperature of 50 deg C. to 100 deg C. for 10 mins to 24 hours, or 1 hour to 5 hours and the like. The recovered powder can be put in sealed bags such as aluminum lined anti-static bags for further use.

With the plasma treatment used in the present invention, the effort put into creating the particle size distribution of the starting metal powder and/or other morphology can carry through to the finished metal powder exiting the plasma process. Put another way, the size of the particle can be substantially maintained except for removing sharp edges and/or removing surface roughness and/or making the starting metal powder spherical or more spherical. Thus, prior to introducing the starting metal powder into the plasma treatment, the starting metal powder can be subjected to one or more steps to achieve desirable particle size distributions and/or other particle characteristics. For instance, the particle size distribution of the starting metal powder can be such that the D10 and/or D90 are within 50%, or within 40%, or within 30%, or within 25%, or within 20%, or within 15%, or within 10% or within 5% of the D50 of that starting metal powder.

The starting metal powder prior to being introduced into the plasma treatment can be subjected to one or more sieving steps or other particle screening steps, for instance to obtain a particle size distribution as described above or other sieve cuts, such as, but not limited to, a minus 200 mesh cut, a minus 225 mesh cut, a minus 250 mesh cut, a minus 275 mesh cut, a minus 300 mesh cut, and so on (with mesh being US Mesh sizes).

The starting metal powder, prior to plasma treating, can have one of the following particle size ranges: the average particle size can be from about 0.5 micron to about 10 microns, or from about 5 microns to about 25 microns, or from about 15 microns to about 45 microns, or from about 35 microns to about 75 microns, or from about 55 microns to about 150 microns, or from about 105 microns to about 250 microns.

In the process to make the metal powder, the starting metal powder can have a first particle size distribution, and the resulting (or finished) metal powder (e.g., after plasma treatment) can have a second particle size distribution, and the first particle size distribution and the second particle size distribution are within 15% of each other, within 10% of each other, or within 5% of each other, or within 2.5% of each other or within 1% of each other.

The starting metal powder prior to being introduced into the plasma treatment can be subjected to deoxidation treatments to remove oxygen from the metal powder.

The starting metal powder prior to plasma treating can be classified or sieved to remove various sizes, for instance, removing particles less than 20 microns, less than 15 microns, less than 10 microns, or less than 5 microns.

After exiting the plasma treatment, the plasma-treated metal powder can be subjected to one or more post-processing steps.

For instance, one post-processing step can be passing the plasma-treated metal powder through one or more sieves to remove certain sized plasma-treated metal powder.

For instance, one post-processing step can be sonicating or using other vibratory techniques to remove imperfections from the metal spheres. For instance, the metal spheres from the plasma treatment can be put in a water bath and sonicated to remove nano materials on the metal spheres and then the metal spheres can be recovered.

For instance, one post-processing step can be optionally subjecting the plasma-treated metal to at least one deoxidation or 'deox' step. The deoxidation can involve subjecting the plasma-treated metal to a temperature of from about 500° C. to about 1,000° C. in the presence of at least one oxygen getter. For instance, the oxygen getter can be a magnesium metal or compound. The magnesium metal can be in the form of plates, pellets, or powder. Other oxygen getter material can be used.

For instance, one post-processing step can be optionally subjecting the plasma-treated metal to one or more heat treatment steps or annealing steps. With regard to the heat treating step of the plasma-treated metal, the heat treating can occur in a conventional oven under vacuum or under inert temperature. The heat treatment temperature is generally at least 800° C., or at least 1,000° C., or from about 800° C. to about 1,450° C., or from about 1,000° C. to about 1,450° C., and the like. While any heat treatment time can be used, examples include, but are not limited to, at least 10 minutes, at least 30 minutes, from about 10 minutes to about 2 hours, or more. As an option, one or more heat treatments can occur, whether at the same temperature, same times, or at different temperatures and/or different heat treatment times. After heat-treatment, if used, the plasma-treated metal can maintain the Hall flow rate achieved prior to the heat-treatment or be within 20% or within 10% or within 5% of that Hall flow rate.

For instance, one post-processing step can be subjecting the plasma-treated metal to acid leaching, such as using conventional techniques or other suitable methods. The various processes described in U.S. Pat. Nos. 6,312,642 and 5,993,513, for example, can be used herein and are incorporated in their entireties by references herein. The acid leaching can be performed using an aqueous acid solution comprising a strong mineral acid as the predominant acid, for example, nitric acid, sulfuric acid, hydrochloric acid, and the like. Also, a hydrofluoric acid (e.g., HF) in minor amounts (e.g., less than 10% by weight, or less than 5% by weight, or less than 1% by weight based on the total weight of acid) can be used. The mineral acid concentration (e.g., $HNO_3$ concentration) can range from about 20% by weight to about 75% by weight in the acid solution. The acid leach can be conducted at elevated temperatures (above room temperature to about 100° C.) or at room temperature, using acid compositions and techniques as shown, for example, in U.S. Pat. No. 6,312,642 B1. The acid leach step typically is performed under normal atmospheric conditions (e.g., approximately 760 mm Hg). The acid leach step performed using conventional acid compositions and pressure conditions, such as indicated, can remove soluble metal oxides from the deoxidized powder for those conditions.

As an option, the plasma-treated metal can be nitrogen doped. With respect to nitrogen, the nitrogen can be in any state, such as a gas, liquid, or solid. The powders of the present invention, can have any amount of nitrogen present as a dopant or otherwise present. Nitrogen can be present as a crystalline form and/or solid solution form at any ratio. Nitrogen doped levels can be from 5 ppm to 5,000 ppm nitrogen or higher.

Further details of the starting metal powder, the plasma-treated metal powder, and components formed from the metal powder are provided below and further form optional aspects of the present invention.

With the present invention, the spherical valve metal powder (e.g., spherical tantalum powder) and/or any optional additional non-spherical metal powder (e.g, non-spherical tantalum powder) can have one or more or all of the following properties:
  a) an apparent density of from about 4 g/cc to about 19.3 g/cc,
  b) a D10 particle size of from about 5 microns to about 25 microns,
  c) a D50 particle size of from about 20 microns to about 50 microns,
  d) a D90 particle size of from about 30 microns to about 100 microns, and/or
  e) a BET surface area of from about 0.05 $m^2$/g to about 20 $m^2$/g.

With the present invention, the spherical metal powder (e.g., spherical tantalum powder) and/or any optional additional non-spherical metal powder (e.g, non-spherical tantalum powder) can have one or more or all of the following properties:
  a) an apparent density of from about 9 g/cc to 19.3 g/cc or from about 9 g/cc to about 16.6 g/cc,
  b) a D10 particle size of from about 12 microns to about 25 microns,
  c) a D50 particle size of from about 20 microns to about 40 microns,
  d) a D90 particle size of from about 30 microns to about 70 microns, and/or
  e) a BET surface area of from about 0.1 $m^2$/g to about 15 $m^2$/g.

For purposes of the present invention, at least one of these properties, at least two, at least three, at least four, or all five properties can be present.

In at least one embodiment of the present invention, the plasma-treated metal powder (or starting metal powder) can have one or more of the following characteristics, but it is to be understood that the powder can have characteristics outside of these ranges:

Purity Levels:
  Oxygen content of from about 100 ppm to about 60,000 ppm, such as from about 250 ppm to about 50,000 ppm or from about 500 ppm to about 30,000 ppm, or from about 1000 ppm to about 20,000 ppm oxygen. An oxygen (in ppm) to BET (in $m^2$/g) ratio can be from about 2,000 to about 4,000, such as from about 2,200 to about 3,800, from about 2,400 to about 3,600, from about 2,600 to about 3,400, or from about 2,800 to about 3,200, and the like.
  A carbon content of from about 1 ppm to about 100 ppm and more preferably, from about 10 ppm to about 50 ppm or from about 20 ppm to about 30 ppm carbon.
  A nitrogen content of from about 100 ppm to about 20,000 ppm or higher and more preferably from about 1,000 ppm to about 5,000 ppm or from about 3,000 ppm to about 4,000 ppm or from about 3,000 ppm to about 3,500 ppm nitrogen.
  A hydrogen content of from about 10 ppm to about 1,000 ppm, and more preferably from about 300 ppm to about 750 ppm, or from about 400 ppm to about 600 ppm hydrogen.
  An iron content of from about 1 ppm to about 50 ppm, and more preferably from about 5 ppm to about 20 ppm iron.
  A nickel content of from about 1 ppm to about 150 ppm, and more preferably from about 5 ppm to about 100 ppm or from about 25 ppm to about 75 ppm nickel.
  A chromium content of from about 1 ppm to about 100 ppm and more preferably from about 5 ppm to about 50 ppm or from about 5 ppm to about 20 ppm chromium.

A sodium content of from about 0.1 ppm to about 50 ppm and more preferably from about 0.5 ppm to about 5 ppm sodium.

A potassium content of from about 0.1 ppm to about 100 ppm and more preferably from about 5 ppm to about 50 ppm, or from about 30 ppm to about 50 ppm potassium.

A magnesium content of from about 1 ppm to about 50 ppm and more preferably from about 5 ppm to about 25 ppm magnesium.

A phosphorus (P) content of from about 5 ppm to about 500 ppm and more preferably from about 100 ppm to about 300 ppm phosphorus.

A fluoride (F) content of from about 1 ppm to about 500 ppm and more preferably from about 25 ppm to about 300 ppm, or from about 50 ppm to about 300 ppm, or from about 100 ppm to about 300 ppm.

The plasma treated powder (or starting metal powder) (primary, secondary, or tertiary) can have a particle size distribution (based on overall %) as follows, based on mesh size:

+60 # of from about 0.0 to about 1% and preferably from about 0.0 to about 0.5% and more preferably 0.0 or about 0.0.

60/170 of from about 45% to about 70% and preferably from about 55% to about 65%, or from about 60% to about 65%.

170/325 of from about 20% to about 50% and preferably from about 25% to about 40% or from about 30% to about 35%.

325/400 of from about 1.0% to about 10% and preferably from about 2.5% to about 7.5% such as from about 4 to about 6%.

−400 of from about 0.1 to about 2.0% and preferably from about 0.5% to about 1.5%.

The plasma-treated metal powder of the present invention can also have a pore size distribution which can be unimodal or multi-modal, such as bi-modal.

The plasma-treated metal powders of the present invention can have a BET surface area of from about 0.01 $m^2/g$ to about 20 $m^2/g$, and more preferably from about 0.05 $m^2/g$ to about 5 $m^2/g$ such as from about 0.1 $m^2/g$ to about 0.5 $m^2/g$.

The starting metal powder can be obtained from a variety of processes used to obtain the metal powder. As stated, the starting metal powder to be plasma-treated can be raw metal powder. Raw metal powder (e.g., basic lot powder) can be obtained or produced by processes which are capable of providing powders having a surface area of at least 0.1 $m^2/g$ or at least 0.5 $m^2/g$. Any metal powders can be used in this regard. Specific examples of the raw tantalum production process include sodium/halide flame encapsulation (SFE), a sodium reduction process of potassium fluorotantalate, a magnesium reduction process of a tantalum oxide, a gas-phase hydrogen reduction process of tantalum pentachloride, and a pulverizing process of tantalum metal. Techniques employed for the SFE process which can be adapted for preparation of raw metal powders (e.g., raw tantalum powder) for the present invention are described in U.S. Pat. Nos. 5,498,446 and 7,442,227, which are incorporated in their entireties by reference herein. This process can be applied to other metals besides tantalum. The encapsulate can be removed in known manners, such as vacuum sublimation and/or a water wash, before use of the tantalum powders in plasma-treated tantalum powder production.

For tantalum, the starting tantalum powder alternatively can be obtained by the sodium reduction of tantalum salt, such as sodium tantalate fluoride in diluent salt, or other chemical or ingot processing methods.

The raw or starting metal powder may comprise primary particles that have an average size in the range of 1 nm to about 500 nm, or 10 nm to 300 nm, or 15 nm to 175 nm, or 20 nm to 150 nm, or 25 nm to 100 nm, or 30 nm to 90 nm, or other sizes. The average size and distribution of the primary particles sizes can depend on the method of preparation. The primary particles may tend to form clusters or agglomerates of larger size than the primary particles. The shapes of raw or starting metal powder particles may include, but are not limited to, flaked, angular, nodular, or spherical, and any combinations thereof or variations thereof. The raw powder used to practice the present invention can have any purity with respect to the metal with higher purities being preferred. For instance, the tantalum purity (e.g., by wt %) of the raw or starting powder can be 95% Ta or greater, or 99% Ta or greater such as from about 99.5% Ta or greater and more preferably 99.95% Ta or greater and even more preferably 99.99% Ta or greater, or 99.995% Ta or greater or 99.999% Ta or greater.

At any stage, before or after plasma-treatment, the metal powder can be passivated using an oxygen-containing gas, such as air, as part of the plasma-treated metal powder production process of the present invention. Passivation typically is used to form a stabilizing oxide film on the powder during processing and in advance of sintered body formation using the powder. A powder production process of the present invention therefore can include hydrogen doping and passivating operations.

Passivating the metal powder can be achieved by any suitable method. Passivation can be achieved in any suitable container, for example, in a retort, a furnace, a vacuum chamber, or a vacuum furnace. Passivation can be achieved in any of the equipment used in processing, such as heat treating, deoxidizing, nitriding, delubing, granulating, milling, and/or sintering, the metal powder. The passivating of the metal powder can be achieved under vacuum. Passivation can include backfilling of the container with an oxygen containing gas to a specified gas pressure, and holding the gas in the container for a specified time. The oxygen content level of the gas used in powder passivation can be from 1 to 100 wt % oxygen, or from 1 to 90 wt %, or from 1 to 75 wt %, or from 1 to 50 wt %, or from 1 to 30 wt %, or from 20 to 30 wt %, or an oxygen content that is the same as or greater than that of air or atmospheric air, or other content levels. The oxygen can be used in combination with an inert gas, such as nitrogen, argon, or combinations of these, or other inert gases. The inert gas does not react with the metal during the passivation process. The inert gas, such as nitrogen gas and/or argon gas, preferably can compose all or essentially all (e.g., >98%) of the remaining portion of the passivating gas other than the oxygen. Air can be used as the passivating gas. Air can refer to atmospheric air or dry air. The composition of dry air typically is nitrogen (about 75.5 wt %), oxygen (about 23.2 wt %), argon (about 1.3 wt %), and the rest in a total amount of less than about 0.05%. The content level of hydrogen in dry air is about 0.00005 vol %.

Additional techniques that may be employed for the passivation process can be adapted from those disclosed in U.S. Pat. No. 7,803,235, which is incorporated in its entirety by reference herein.

The present invention will be further clarified by the following examples, which are intended to be purely exemplary of the present invention.

EXAMPLES

Example 1

Commercially available $KTa_2F_7$ (KTAF) and sodium were used to obtain tantalum powder using a sodium reduction of the KTAF utilizing standard industry processes. The salt byproducts were removed by washing and acid leaching and drying steps. The resulting tantalum powder had a BET of about 0.1 $m^2/g$. This tantalum was a basic lot tantalum powder. FIG. 1A shows a SEM of this starting tantalum powder. The starting tantalum powder was divided into three lots of powder—Lots A, B, and C and each was separately plasma treated as described below.

Next, the basic lot tantalum powder was plasma treated. Particularly, the basic lot tantalum powder was spheroidized by introducing the basic lot tantalum powder into a feeder. The feeder had an argon supply (5 LPM) that aerosolizes the powder into the plasma spheroidization reactor (TEK15, from Tekna, Canada). The feed rate of the powder was maintained at 0.75 kg/hr by adjusting the feeder. The aerosolized powder was introduced into the plasma heat source of the plasma reactor. The plasma reactor had an induction plasma torch using a design described in U.S. Pat. No. 5,200,595 and WO 92/19086 using concentric tubes. The plasma energy used to spheroidize the powder was 15 KW with plate voltage set at 6.5 V, plate current set at 2.3 A and grid current set at 0.4 A. The reactor was inerted using argon gas flow with carrier gas flow set at 5 LPM, sheath gas flow set at 30 LPM, central gas flow set at 10 LPM and nozzle gas flow set at 1 LPM. The plasma intensity was increased by adding hydrogen gas (using flow rates of 4 LPM). The run conditions are summarized in Table 1. The basic lot tantalum powder introduced into the plasma torch was at least partially melted and then spheroidized, and the liquid drops of tantalum were carried downstream from the plasma torch where they cooled rapidly by an active water cooling jacket on the plasma reactor. In this example, the cooled spheroid tantalum powder dropped to the bottom of the plasma reactor via gravity and the spheroid powder was collected under argon gas blanket, and passivated in a water bath. Once under water, the slurry was sonicated (energy<150 W/gal.) to remove potential nanomaterials deposited on surface of spheroid powder. The washed tantalum spheres were then dried under argon at 80° C. for 4 hours. The dried powder was then packaged in Al lined anti-static bags until tested for properties.

Figure 1B:
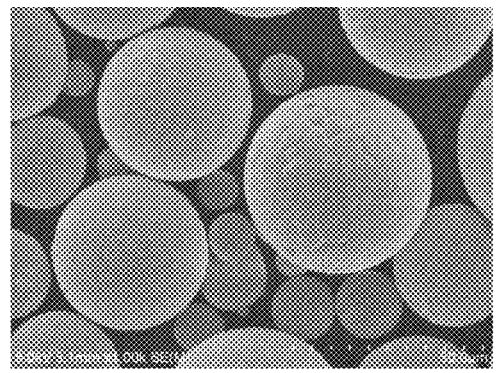

The results are shown in Table 2 for the impurity levels, and in Table 3 for the particle size distribution, and the apparent density and Hall flow rate and FIG. 1B shows a SEM image of the plasma treated powder of Lot A. In each of Lots A, B, and C, the aspect ratio was about 1.0 to 1.1.

TABLE 1

| Feed | Power | Argon gas pressure | Argon Flow - LPM | | | | Hydrogen (LPM) | Plate Voltage (V) | Plate Current (A) | Grid Current (A) | Ta feed rate (kg/hr) |
| | | | Carrier Gas | Shealth Gas | Central Gas | Nozzle | | | | | |
| --- | --- | --- | --- | --- | --- | --- | --- | --- | --- | --- | --- |
| Tantalum | 15 KW | 15 psia | 5 | 30 | 10 | 1 | 4 | 6.55 | 2.3 | 0.4 | 0.75 |

TABLE 2

| | (ppm) | | | | | | | | | | | | |
| Lot | O | N | H | C | S | Cr | Fe | Mg | K | Ni | Na | Ti | W |
| --- | --- | --- | --- | --- | --- | --- | --- | --- | --- | --- | --- | --- | --- |
| A | 310 | 22 | 71 | 11 | <10 | <2 | <3 | <1 | 2 | 25 | 2 | <1 | <1 |
| B | 276 | 40 | 65 | 10 | <10 | <2 | <3 | <1 | 2 | 12 | <1 | <1 | <1 |
| C | 354 | 18 | 70 | 14 | <10 | <2 | <3 | <1 | <1 | 11 | <1 | <1 | <1 |

TABLE 3

| | (microns) | | | Apparent | Hall Flow |
| Lot | D10 | D50 | D90 | Density | (s) |
| --- | --- | --- | --- | --- | --- |
| A | 16.40 | 34.23 | 65.17 | 9.78 | 5.97 |
| B | 20.46 | 39.87 | 71.33 | 9.75 | 5.85 |
| C | 24.38 | 44.06 | 76.44 | 9.58 | 6.34 |

Example 2

Figure 2A:
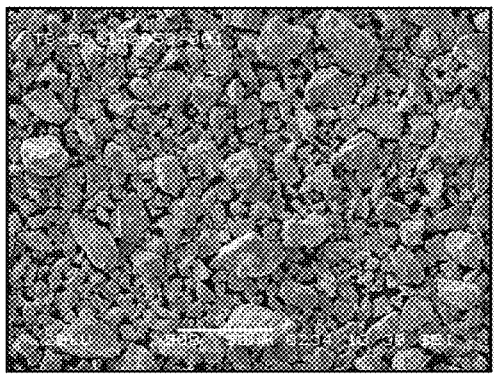
FIG. 2A is a SEM photograph of the starting basic lot tantalum powder used in Example 2 (after being crushed and sieved) and FIG. 2B is a SEM photograph of the finished tantalum powder of Example 2 after plasma treatment.

In this example, basic lot tantalum powder (sodium reduced powder) as in Example 1 was used. This basic lot tantalum powder had a BET of 0.1 $m^2/g$. The basic lot tantalum powder was pressed and sintered into green logs utilizing a sinter temperature of about 1,000 deg C. for one hour. The green logs were fed into an e-beam furnace where the metal was melted via a crucible. The melt was drawn through a die where the tantalum solidified and formed the ingot. The tantalum ingot was hydrided using a high temperature furnace with a hydrogen atmosphere and allowed to cool to room temperature after hydriding. The hydrided ingot was then crushed (using a jaw crush and then a roll crush) and screened to a sieve side of −20 #. The crushed ingot was screened to a desired size cut which was 10-25 microns for Lot A (or 35-75 microns for Lot B). The screened powder for each Lot was then acid leached. The powder was then subjected to deoxidation using magnesium to lower the oxygen levels to below 500 ppm. FIG. 2A shows a SEM of this starting tantalum powder. Each of Lot A and Lot B was then separately subjected to plasma treating in the same manner as Example 1.

Figure 2B:
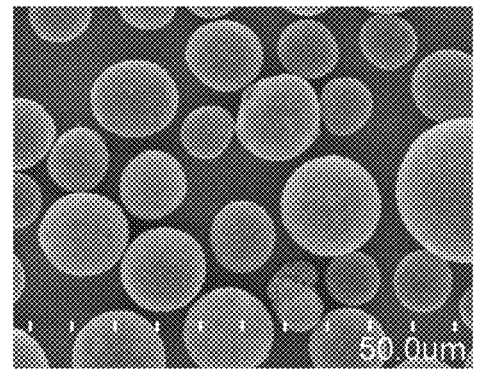

The results are shown in Table 4 for the impurity levels, and in Table 5 for the particle size distribution, and the apparent density and Hall flow rate and FIG. 2B shows a SEM image of the plasma treated powder of Lot A. In each of Lots A and B, the aspect ratio was about 1.0 to 1.1.

TABLE 4

| | (ppm) | | | | | | | | | | | | |
|---|---|---|---|---|---|---|---|---|---|---|---|---|---|
| Lot | O | N | H | C | S | Cr | Fe | Mg | K | Ni | Na | Ti | W |
| A | 633 | 12 | 415 | 15 | <10 | <2 | <3 | <1 | <1 | 20 | 1 | <1 | <1 |
| B | 936 | 54 | 1986 | 21 | <10 | <2 | <3 | <1 | <1 | 10 | 2 | 4 | <1 |

TABLE 5

| | (microns) | | | Apparent | Hall Flow |
|---|---|---|---|---|---|
| Lot | D10 | D50 | D90 | Density | (s) |
| A | 7 | 13 | 21 | 9.3 | 7.3 |
| B | 20 | 40 | 71 | 9.5 | 9.8 |

The spherical powder made can then be used to form a consolidated powder metallurgy article, for instance, in the shape of a sputtering target following the methods described earlier.

The present invention includes the following aspects/embodiments/features in any order and/or in any combination:

1. A method for forming a powder metallurgy article, comprising:
   consolidating a metal powder that includes a spherical metal powder into a consolidated body by a powder metallurgy technique to form a metallurgical article; and
   optionally heating treating said consolidated body; wherein said spherical metal powder comprises
   a. a spherical shape wherein the powder has an average aspect ratio of from 1.0 to 1.4;
   b. a purity of metal of at least 99 wt % metal based on total weight of said metal powder, excluding gas impurities;
   c. an average particle size of from about 0.5 micron to about 250 microns;
   d. an apparent density from about 4 g/cc to about 19.3 g/cc;
   e. a true density that is within +−3% of the metal; and
   f. a Hall flow rate of 40 sec or less.

2. The method of any preceding or following embodiment/feature/aspect, wherein said heat treating is utilized.

3. The method any preceding or following embodiment/feature/aspect, wherein said heat treating is one or more sintering steps or one or more annealing steps.

4. The method of any preceding or following embodiment/feature/aspect, wherein said consolidated product is a sputtering target.

5. The method of any preceding or following embodiment/feature/aspect, further comprising machining said consolidated product.

6. The method of any preceding or following embodiment/feature/aspect, further comprising subjecting said consolidated product to one or more mechanical or thermo-mechanical processing steps.

7. The method of any preceding or following embodiment/feature/aspect, wherein said method is conducted in the absence of any mechanical or thermo-mechanical processing step.

8. The method of any preceding or following embodiment/feature/aspect, wherein said metal powder has an oxygen level of less than 350 ppm.

9. The method of any preceding or following embodiment/feature/aspect, wherein said metal powder has an oxygen level of less than 200 ppm.

10. The method of any preceding or following embodiment/feature/aspect, wherein said average aspect ratio is from 1.0 to 1.25.

11. The method of any preceding or following embodiment/feature/aspect, wherein said average aspect ratio is from 1.0 to 1.1.

12. The method of any preceding or following embodiment/feature/aspect, wherein said purity is at least 99.995 wt % metal.

13. The method of any preceding or following embodiment/feature/aspect, wherein said average particle size is from about 0.5 micron to about 10 microns.

14. The method of any preceding or following embodiment/feature/aspect, wherein said average particle size is from about 5 microns to about 25 microns.

15. The method of any preceding or following embodiment/feature/aspect, wherein said average particle size is from about 15 microns to about 45 microns.

16. The method of any preceding or following embodiment/feature/aspect, wherein said average particle size is from about 35 microns to about 75 microns.

17. The method of any preceding or following embodiment/feature/aspect, wherein said average particle size is from about 55 microns to about 150 microns.

18. The method of any preceding or following embodiment/feature/aspect, wherein said average particle size is from about 105 microns to about 250 microns.

19. The method of any preceding or following embodiment/feature/aspect, wherein said metal powder has at least one of the following properties:
   a. a D10 size of from about 5 microns to 25 microns; or
   b. a D90 size of from about 20 microns to 80 microns.

20. The method of any preceding or following embodiment/feature/aspect, wherein said metal powder is selected from tantalum, niobium, aluminum, copper, titanium, magnesium, tungsten, gold, silver, cobalt, zirconium, silicon, rhenium, molybdenum, or alloys thereof, or any combinations thereof.

21. The method of any preceding or following embodiment/feature/aspect, wherein said metal powder comprises or is selected from a BBC metal.

22. The method of any preceding or following embodiment/feature/aspect, wherein said metal powder further comprises non-spherical metal powder.

23. The method of any preceding or following embodiment/feature/aspect, wherein said non-spherical metal powder comprises angular metal powder, flake metal powder, and/or nodular metal powder.

24. The method of any preceding or following embodiment/feature/aspect, wherein said metal powder comprises from 1% to 99% by weight of said spherical metal powder and from 1% to 99% by weight of said non-spherical metal powder.

25. The method of any preceding or following embodiment/feature/aspect, wherein said metal powder comprises from 25% to 75% by weight of said spherical metal powder and from 25% to 75% by weight of said non-spherical metal powder.

26. The method of any preceding or following embodiment/feature/aspect, wherein said metal powder comprises from 50% to 99% by weight of said spherical metal powder and from 1% to 50% by weight of said non-spherical metal powder.

27. The method of any preceding or following embodiment/feature/aspect, wherein said metal powder comprises from 75% to 99% by weight of said spherical metal powder and from 1% to 25% by weight of said non-spherical metal powder.
28. The method of any preceding or following embodiment/feature/aspect, wherein said spherical metal powder comprises at least two different size fractions based on average particle size.
29. The method of any preceding or following embodiment/feature/aspect, wherein said spherical metal powder comprises a first size fraction having an average particle size from about 10 microns to about 25 microns, and a second size fraction of from about 26 microns to about 45 microns.
30. The method of any preceding or following embodiment/feature/aspect, wherein said consolidated product is in the shape of a billet, and said method further comprises dividing said billet into multiple discs, each having a shape of a sputtering target.
31. The method of any preceding or following embodiment/feature/aspect, said method further comprises:
   a. plasma heat-treating a starting metal powder to at least partially melt at least an outer surface of said starting metal powder in an inert atmosphere to obtain a heat-treated metal powder, and
   b. cooling said heat-treated metal powder in an inert atmosphere to obtain said metal powder.
32. The method of any preceding or following embodiment/feature/aspect, wherein said starting metal powder is tantalum powder.
33. The method of any preceding or following embodiment/feature/aspect, wherein said metal powder has an oxygen content of 500 ppm or less and has a nitrogen content of at least about 40 ppm.
34. The method of any preceding or following embodiment/feature/aspect, wherein said consolidating is at a temperature not exceeding 0.7 $T_H$ of said metal powder.
35. The method of any preceding or following embodiment/feature/aspect, wherein said consolidating comprises compressing said metal powder to from about 80 to about 100% of theoretical density with compressive forces of from about 30,000 to about 90,000 psi.
36. The method of any preceding or following embodiment/feature/aspect, wherein said powder metallurgy technique comprises hot isostatic pressing or cold isostatic pressing or vacuum hot pressing.
37. The method of any preceding or following embodiment/feature/aspect, wherein said powder metallurgy technique comprises extrusion.
38. A powder metallurgy article comprising a metal powder that is consolidated into a consolidated body that has a density of at least 75% of the theoretical density, wherein said metal powder comprises a spherical metal powder, said spherical metal powder comprising
   a. a spherical shape wherein the powder has an average aspect ratio of from 1.0 to 1.4;
   b. a purity of metal of at least 99 wt % metal based on total weight of said metal powder, excluding gas impurities;
   c. an average particle size of from about 0.5 micron to about 250 microns;
   d. an apparent density from about 4 g/cc to about 19.3 g/cc;
   e. a true density that is within +−3% of the metal; and
   f. a Hall flow rate of 40 sec or less.
39. The powder metallurgy article of any preceding or following embodiment/feature/aspect, wherein said spherical metal powder is plasma heat-treated.
40. The powder metallurgy article of any preceding or following embodiment/feature/aspect, wherein said powder metallurgy article has an oxygen level of less than 350 ppm.
41. The powder metallurgy article of any preceding or following embodiment/feature/aspect, wherein said powder metallurgy article has an oxygen level of less than 200 ppm.
42. The powder metallurgy article of any preceding or following embodiment/feature/aspect, wherein said average aspect ratio is from 1.0 to 1.25.
43. The powder metallurgy article of any preceding or following embodiment/feature/aspect, wherein said average aspect ratio is from 1.0 to 1.1.
44. The powder metallurgy article of any preceding or following embodiment/feature/aspect, wherein said powder metallurgy article has a purity of at least 99.995 wt % metal.
45. The powder metallurgy article of any preceding or following embodiment/feature/aspect, wherein said average particle size is from about 0.5 micron to about 10 microns.
46. The powder metallurgy article of any preceding or following embodiment/feature/aspect, wherein said average particle size is from about 5 microns to about 25 microns.
47. The powder metallurgy article of any preceding or following embodiment/feature/aspect, wherein said average particle size is from about 15 microns to about 45 microns.
48. The powder metallurgy article of any preceding or following embodiment/feature/aspect, wherein said average particle size is from about 35 microns to about 75 microns.
49. The powder metallurgy article of any preceding or following embodiment/feature/aspect, wherein said average particle size is from about 55 microns to about 150 microns.
50. The powder metallurgy article of any preceding or following embodiment/feature/aspect, wherein said average particle size is from about 105 microns to about 250 microns.
51. The powder metallurgy article of any preceding or following embodiment/feature/aspect, wherein said metal powder has at least one of the following properties:
   a. a D10 size of from about 5 microns to 25 microns; or
   b. a D90 size of from about 20 microns to 80 microns.
52. The powder metallurgy article of any preceding or following embodiment/feature/aspect, wherein said powder metallurgy article comprises niobium, tantalum, or a combination thereof.
53. The powder metallurgy article of any preceding or following embodiment/feature/aspect, wherein said powder metallurgy article comprises a BBC metal.
54. The powder metallurgy article of any preceding or following embodiment/feature/aspect, wherein said metal powder further comprises non-spherical metal powder.
55. The powder metallurgy article of any preceding or following embodiment/feature/aspect, wherein said non-spherical metal powder comprises angular metal powder, flake metal powder, nodular metal powder.
56. The powder metallurgy article of any preceding or following embodiment/feature/aspect, wherein said metal powder comprises from 1% to 99% by weight of said spherical metal powder and from 1% to 99% by weight of said non-spherical metal powder.
57. The powder metallurgy article of any preceding or following embodiment/feature/aspect, wherein said metal powder comprises from 25% to 75% by weight of said spherical metal powder and from 25% to 75% by weight of said non-spherical metal powder.
58. The powder metallurgy article of any preceding or following embodiment/feature/aspect, wherein said metal powder comprises from 50% to 99% by weight of said spherical metal powder and from 1% to 50% by weight of said non-spherical metal powder.

59. The powder metallurgy article of any preceding or following embodiment/feature/aspect, wherein said metal powder comprises from 75% to 99% by weight of said spherical metal powder and from 1% to 25% by weight of said non-spherical metal powder.

60. The powder metallurgy article of any preceding or following embodiment/feature/aspect, wherein said spherical metal powder comprises at least two different size fractions based on average particle size.

61. The powder metallurgy article of any preceding or following embodiment/feature/aspect, wherein said spherical metal powder comprises a first size fraction having an average particle size from about 10 microns to about 25 microns, and a second size fraction of from about 26 microns to about 45 microns.

62. A sputtering target assembly comprising the powder metallurgy article of any preceding or following embodiment/feature/aspect as a sputter target and a backing plate.

63. The sputtering target assembly of any preceding or following embodiment/feature/aspect, wherein said sputter target has a yield strength of from about 18,000 to about 40,000 psi and an elongation to failure of about 20% or more.

64. The sputtering target assembly of any preceding or following embodiment/feature/aspect, wherein said sputter target has a purity of from about 99.5% or greater.

65. The sputtering target assembly of any preceding or following embodiment/feature/aspect, wherein said sputter target has an average grain size of about 300 microns or less.

66. The sputtering target assembly of any preceding or following embodiment/feature/aspect, wherein said sputter target has an average grain size of 100 microns or less.

67. The sputtering target assembly of any preceding or following embodiment/feature/aspect, wherein said sputter target has an average grain size of about 50 microns or less.

68. The sputtering target assembly of any preceding or following embodiment/feature/aspect, wherein said sputter target has an average grain size of about 10 microns or less.

69. The sputtering target assembly of any preceding or following embodiment/feature/aspect, wherein said sputter target has a random texture on the surface or throughout the entire thickness of said metal.

70. The sputtering target assembly of any preceding or following embodiment/feature/aspect, wherein said sputter target has a uniform primary texture on the surface or throughout the entire thickness of said metal.

71. The sputtering target assembly of any preceding or following embodiment/feature/aspect, wherein said sputter target has a uniform primary texture of (111) on the surface or throughout the entire thickness of said metal.

72. The sputtering target assembly of any preceding or following embodiment/feature/aspect, wherein said sputter target has a random texture on the surface or throughout the entire thickness of said metal.

73. The sputtering target assembly of any preceding or following embodiment/feature/aspect, wherein said sputter target has a uniform primary texture of (110) on the surface or throughout the entire thickness of said metal.

The present invention can include any combination of these various features or embodiments above and/or below as set forth in sentences and/or paragraphs. Any combination of disclosed features herein is considered part of the present invention and no limitation is intended with respect to combinable features.

Applicant specifically incorporates the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. A method for forming a powder metallurgy article, comprising:
   consolidating a metal powder that includes a spherical metal powder into a consolidated body by a powder metallurgy technique to form a metallurgical article; and
   optionally heating treating said consolidated body; wherein said spherical metal powder is i) tantalum or ii) an alloy of tantalum wherein tantalum is the predominate metal present, and said spherical metal powder has the following properties:
   a. a spherical shape wherein the powder has an average aspect ratio of from 1.0 to 1.4;
   b. a purity of metal of at least 99 wt % metal based on total weight of said metal powder, excluding gas impurities;
   c. an average particle size of from about 0.5 micron to about 250 microns;
   d. an apparent density from about 4 g/cc to about 12.6 g/cc;
   e. a true density of 16.6 g/cc+−3%; and
   f. a Hall flow rate of 20 sec or less.

2. The method of claim 1, wherein said heat treating is utilized.

3. The method of claim 2, wherein said heat treating is one or more sintering steps or one or more annealing steps.

4. The method of claim 1, wherein said consolidated body is a sputtering target.

5. The method of claim 1, further comprising subjecting said consolidated body to one or more mechanical or thermo-mechanical processing steps.

6. The method of claim 1, wherein said method is conducted in the absence of any mechanical or thermo-mechanical processing step.

7. The method of claim 1, wherein said metal powder has an oxygen level of less than 350 ppm.

8. The method of claim 1, wherein said metal powder has an oxygen level of less than 200 ppm.

9. The method of claim 1, wherein said average aspect ratio is from 1.0 to 1.25.

10. The method of claim 1, wherein said average aspect ratio is from 1.0 to 1.1.

11. The method of claim 1, wherein said purity is at least 99.995 wt % metal.

12. The method of claim 1, wherein said average particle size is from about 0.5 micron to about 10 microns, or from about 5 microns to about 25 microns or from about 15 microns to about 45 microns or from about 35 microns to about 75 microns or from about 55 microns to about 150 microns or from about 105 microns to about 250 microns.

13. The method of claim 1, wherein said metal powder has at least one of the following properties:
  a. a D10 size of from about 5 microns to 25 microns; or
  b. a D90 size of from about 20 microns to 80 microns.

14. The method of claim 1, wherein said metal powder further comprises non-spherical metal powder that is tantalum or a tantalum alloy.

15. The method of claim 14, wherein said metal powder comprises from 75% to 99% by weight of said spherical metal powder and from 1% to 25% by weight of said non-spherical metal powder.

16. The method of claim 1, wherein said spherical metal powder comprises at least two different size fractions based on average particle size.

17. The method of claim 1, wherein said spherical metal powder comprises a first size fraction having an average particle size from about 10 microns to about 25 microns, and a second size fraction of from about 26 microns to about 45 microns.

18. The method of claim 1, said method further comprises:
  a. plasma heat-treating a starting metal powder to at least partially melt at least an outer surface of said starting metal powder in an inert atmosphere to obtain a heat-treated metal powder, and
  b. cooling said heat-treated metal powder in an inert atmosphere to obtain said metal powder.

19. The method of claim 18, wherein said starting metal powder is tantalum powder.

20. The method of claim 1, wherein said metal powder has an oxygen content of 500 ppm or less and has a nitrogen content of at least about 40 ppm.

21. The method of claim 1, wherein said consolidating comprises compressing said metal powder to from about 80 to about 100% of theoretical density with compressive forces of from about 30,000 to about 90,000 psi.

\* \* \* \* \*